US011091088B2

(12) United States Patent
Padilla Guardado et al.

(10) Patent No.: US 11,091,088 B2
(45) Date of Patent: Aug. 17, 2021

(54) FAILURE DETECTION CIRCUIT FOR HYBRID TURN SIGNAL LAMPS

(71) Applicant: HELLA GmbH & Co. KGaA, Lippstadt (DE)

(72) Inventors: Eleazar Padilla Guardado, Farmington Hills, MI (US); Jose Miguel Mercado Pena, Canton, MI (US)

(73) Assignee: HELLA GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 16/981,970

(22) PCT Filed: Mar. 20, 2019

(86) PCT No.: PCT/IB2019/052266
§ 371 (c)(1),
(2) Date: Sep. 17, 2020

(87) PCT Pub. No.: WO2019/180639
PCT Pub. Date: Sep. 26, 2019

(65) Prior Publication Data
US 2021/0114512 A1    Apr. 22, 2021

Related U.S. Application Data

(60) Provisional application No. 62/645,891, filed on Mar. 21, 2018.

(51) Int. Cl.
*B60Q 1/34* (2006.01)
*B60Q 11/00* (2006.01)
(Continued)

(52) U.S. Cl.
CPC .............. *B60Q 1/34* (2013.01); *G01R 31/44* (2013.01); *H05B 35/00* (2013.01); *H05B 45/54* (2020.01); *B60Q 2400/20* (2013.01)

(58) Field of Classification Search
CPC .. B60Q 11/00; B60Q 11/005; B60Q 2400/00; B60Q 2400/20; H05B 45/30;
(Continued)

(56) References Cited

U.S. PATENT DOCUMENTS 6,490,512 B1 * 12/2002 Niggemann ......... H05B 47/185
701/29.1
8,072,223 B1 * 12/2011 Sioma .................. B60Q 11/005
324/414

(Continued)

FOREIGN PATENT DOCUMENTS

| GB | 2511095 A | 8/2014 |
|---|---|---|
| WO | 2010030336 A1 | 3/2010 |

OTHER PUBLICATIONS

International Search Report and Written Opinion of International Application PCT/IB2019/052266 dated Jul. 22, 2019.

*Primary Examiner* — Thai Pham
(74) *Attorney, Agent, or Firm* — Warner Norcross + Judd LLP

(57) ABSTRACT

A failure detection circuit capable of detecting an outage for a hybrid turn signal lamp is provided. The failure detection circuit is capable of detecting the failure of an incandescent light source and an LED light source and capable of sending a single failure signal to a body control module (BCM). The failure detection circuit includes an outage detection module connected in series between a power supply and an incandescent light source. The failure detection circuit also includes a lamp driver circuit adapted to detect a change in LED current or voltage that is indicative of a LED light source failure and thereafter output the failure signal to the BCM.

18 Claims, 5 Drawing Sheets

(51) Int. Cl.
    *H05B 45/50*     (2020.01)
    *H05B 45/54*     (2020.01)
    *G01R 31/44*     (2020.01)
    *H05B 35/00*     (2006.01)

(58) Field of Classification Search
    CPC ........ H05B 45/50; H05B 45/58; H05B 47/20; H05B 35/00; H05B 39/00; G01R 31/44; B06Q 1/34
    See application file for complete search history.

(56) References Cited

U.S. PATENT DOCUMENTS

| | | |
|---|---|---|
| 2005/0007025 A1 | 1/2005 | Gauna |
| 2017/0072854 A1* | 3/2017 | Cornelius .............. H05B 47/25 |
| 2017/0109997 A1* | 4/2017 | Brooks ................ G01R 31/006 |
| 2018/0049301 A1* | 2/2018 | Brombach ........... B60Q 11/005 |

* cited by examiner

FAILURE DETECTION CIRCUIT FOR HYBRID TURN SIGNAL LAMPS

CROSS-REFERENCE TO RELATED APPLICATION

This application claims the benefit of U.S. Provisional Application 62/645,891, filed Mar. 21, 2018, the disclosure of which is incorporated by reference in its entirety.

FIELD OF THE INVENTION

The present invention relates to control circuits for exterior vehicle lighting and, in particular, control circuits for detecting a turn signal lamp failure.

BACKGROUND OF THE INVENTION

Several automotive lighting standards require a driver warning in the case of a turn signal failure. For example, FMVSS 108 and CMVSS 108 each require an illuminated indicator to turn steady on/steady off or to significantly change its flash rate. The detection of a turn signal failure is typically performed by one or more failure detection circuits, which in turn depends upon the light source contained within the vehicle turn signal lamp.

Conventional turn signal lamps include an incandescent light source. In the case of an incandescent light source failure, a body control module (BCM) detects a relatively large current drop to the turn signal lamp. LED light sources, by contrast, require significantly less power than an incandescent light source. Consequently, a dedicated module inside the LED turn signal lamp is required in order to detect a failure in an LED light source.

Due to the increasing complexity of vehicle systems, it is desirable to provide hybrid turn signal lamps that include an incandescent light source and one or more LED light sources. Accordingly, there remains a continued need for an improved system for detecting a light source failure while complying with automotive lighting standards for hybrid turn signals.

SUMMARY OF THE INVENTION

A failure detection circuit and a method for detecting a light source failure in a hybrid turn signal lamp are provided. The hybrid turn signal lamp includes a single fixture having an incandescent lamp and multiple LED light sources. According to one embodiment, the method generally includes monitoring a current drawn by the incandescent lamp and monitoring a current or a voltage across the LED light sources. An outage detection module in proximity to the hybrid turn signal lamp monitors for a failure in the incandescent lamp and monitors for a failure in the LED light sources. The outage detection module outputs a common lamp failure signal to a body control module (BCM) if a failure is detected while in an operating state, e.g., when receiving a periodic voltage in response to activation of a turn signal switch.

In one embodiment, the failure detection circuit is capable of detecting the failure of an incandescent light source and an LED light source and capable of sending a single failure signal to the vehicle BCM, thereby reducing the number of wires in the vehicle harness and the BCM resources demand. The failure detection circuit includes an outage detection module connected in series between a power supply and an incandescent turn signal lamp. The outage detection module is configured to detect a lamp failure during operating conditions and to provide a failure signal to the vehicle BCM. The failure detection circuit is also configured to detect a fault in one or more LED light sources. For example, the failure detection circuit can include a lamp driver circuit adapted to detect a change in LED current or voltage that is indicative of a LED light source failure and thereafter output a failure signal to the vehicle BCM.

The outage detection module can be implemented as an additional lamp PCB, as part of a pre-existing PCB, or as an external module that is connected to the lamp through a wiring harness. As discussed herein, the outage detection module provides an isolated circuit that does not affect the current that the light sources receive and therefore does not imply an additional electrical load to the overall system. The outage detection module also reduces the potential risk of failure of detection by centralizing the detection in a single device.

These and other features and advantages of the present invention will become apparent from the following description of the invention, when viewed in accordance with the accompanying drawings and appended claims.

DETAILED DESCRIPTION OF THE CURRENT EMBODIMENTS

Figure 1:
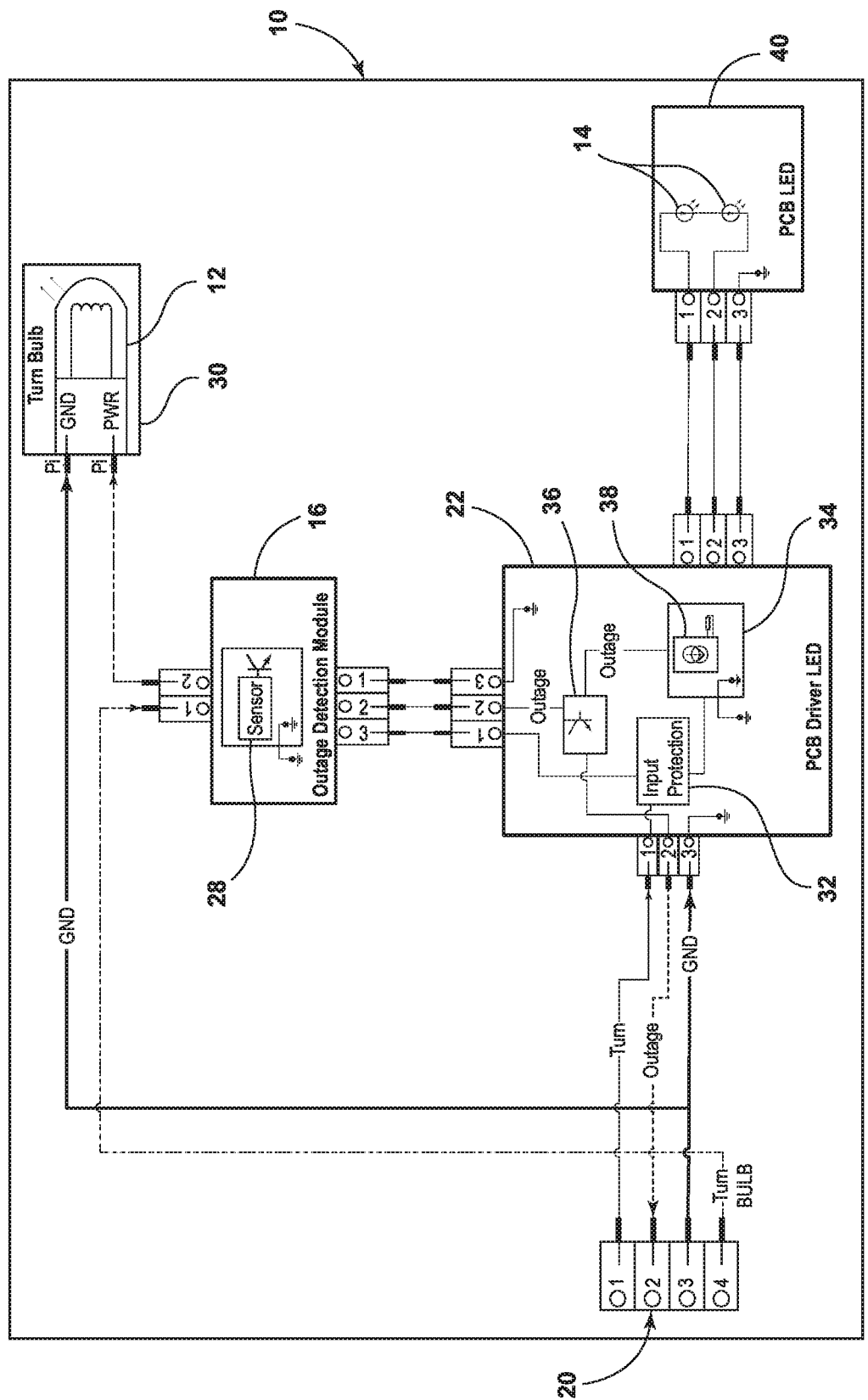
FIG. 1 is a circuit diagram of a failure detection circuit including an outage detection module in accordance with a first embodiment.
Figure 3:
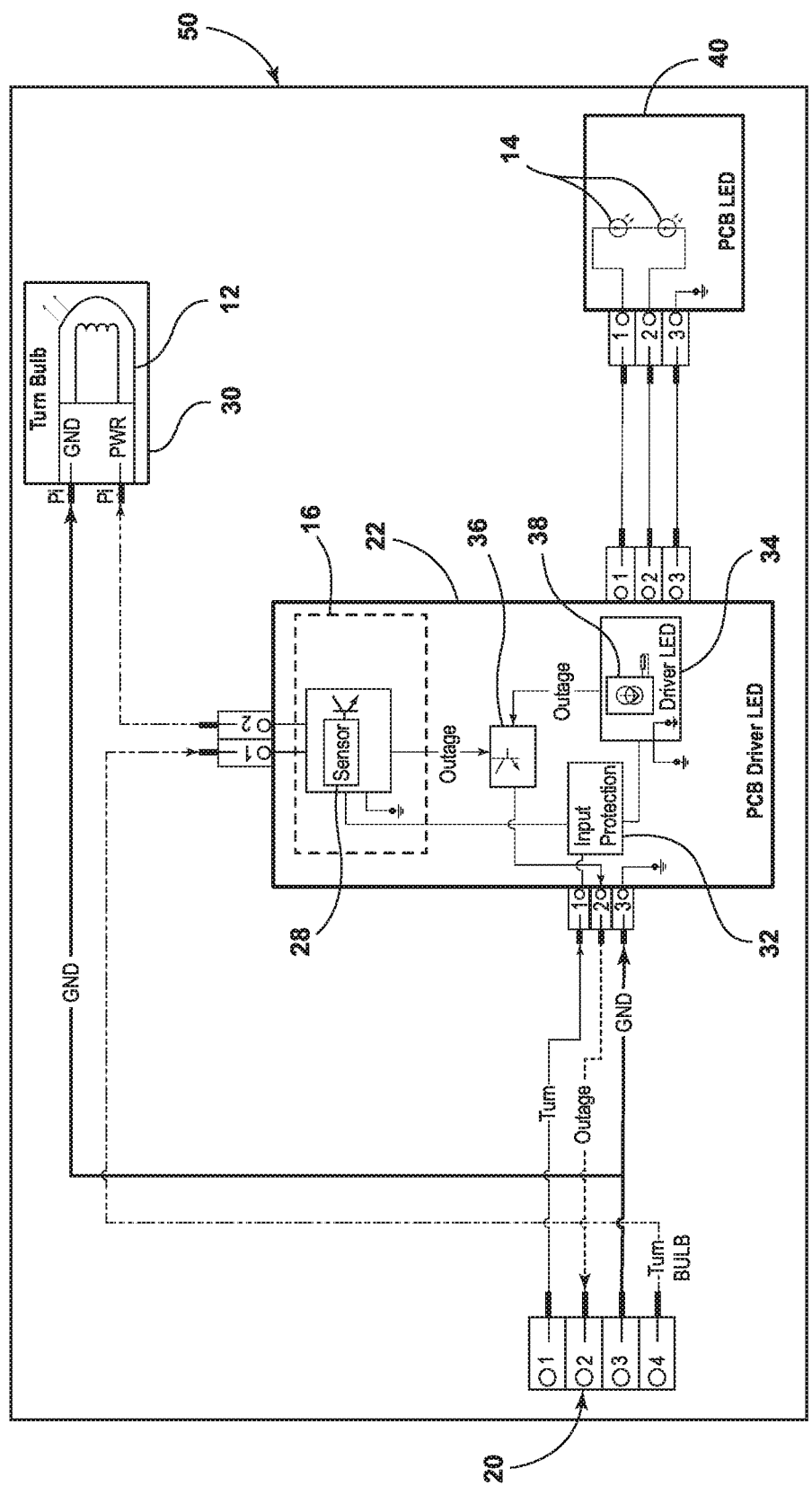
FIG. 3 is a circuit diagram of a failure detection circuit including an outage detection module in accordance with a second embodiment.
Figure 4:
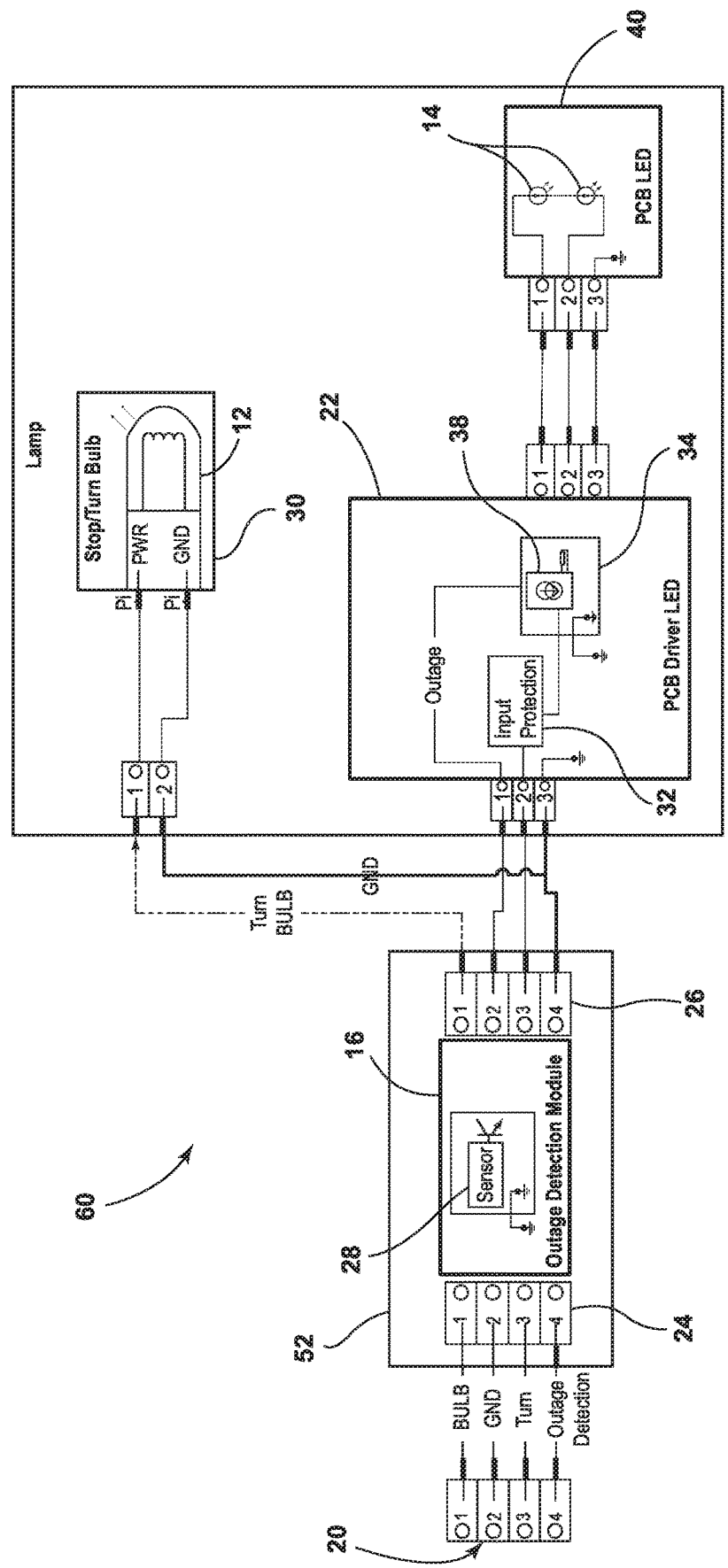
FIG. 4 is a circuit diagram of a failure detection circuit including an outage detection module in accordance with a third embodiment.

Referring to FIG. 1, a failure detection circuit for a hybrid turn signal lamp is illustrated and generally designated 10, wherein the hybrid turn signal lamp includes a single fixture having an incandescent lamp 12 and multiple LED light sources 14. The failure detection circuit 10 includes an outage detection module 16 that is configured to detect an outage in the incandescent light source 12 for output to the vehicle BCM as a lamp failure signal. Though illustrated as an additional PCB for a turn signal lamp 10, the outage detection module 16 can additionally be integrated into a pre-existing lamp PCB (FIG. 3) or as an external module connected to the lamp 10 through a wiring harness (FIG. 4).

More specifically, the failure detection circuit 10 includes a four-pin connector 20 with the following (in order from top to bottom in FIG. 1) a turn signal input, an outage output, ground, and an input voltage. The turn signal input is electrically connected to a lamp driver circuit 22 for activating the incandescent light source 12 and the LED light sources 14 under control of the vehicle BCM. The outage output is electrically connected to the vehicle BCM and is HIGH or LOW dependent upon the presence or absence of a lamp outage, respectively. The ground connector is coupled to both of the incandescent lamp 12 and the lamp driver circuit 22. Lastly, the input voltage is coupled to the outage detection module 16 for providing power to the incandescent light source 12 and the LED light sources 14.

Figure 2:
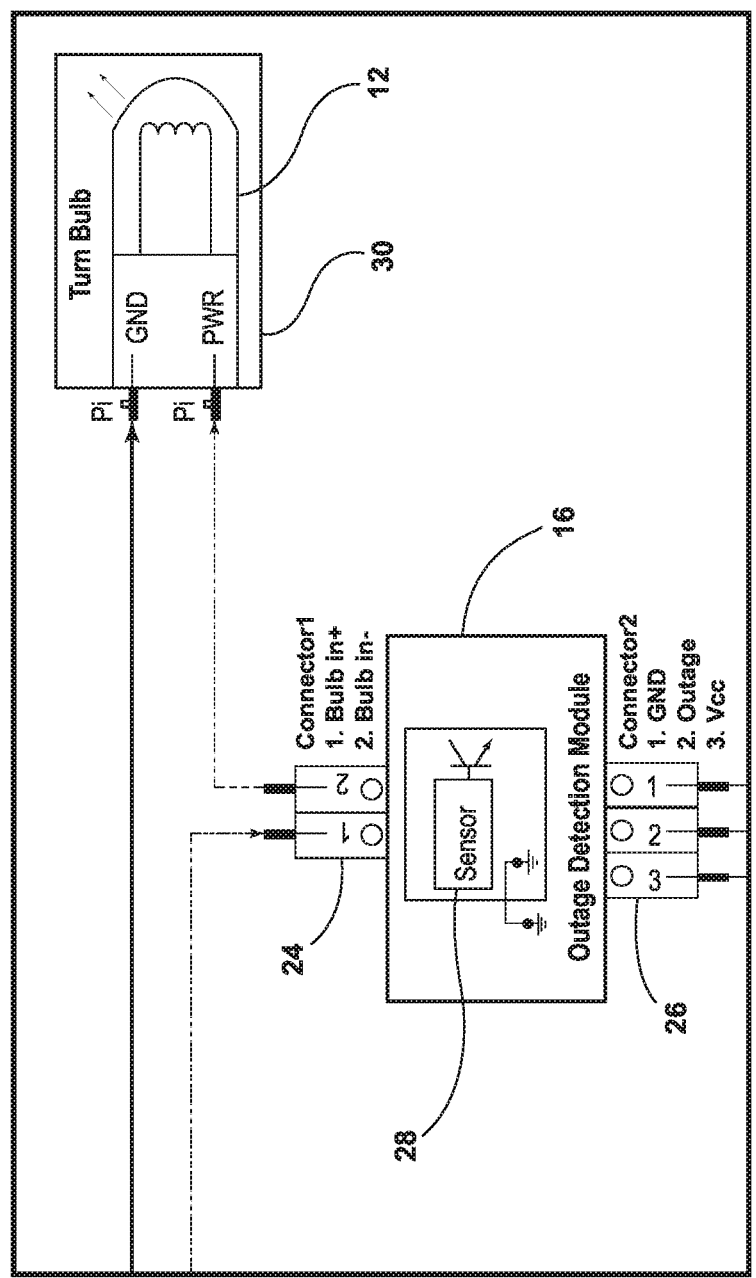
FIG. 2 is a close-up of the outage detection module of FIG. 1.

Referring now to FIG. 2, the outage detection module 16 includes a first connector 24 and a second connector 26. The first connector 24 electrically connects the outage detection module 16 in series between the connector input voltage 20 and the incandescent light source 12, for example an amber halogen bulb. The second connector 26 includes ground, outage, and a supply voltage (Vcc). The outage detection module 16 is configured to monitor for a drop in the current to the incandescent bulb 12. In the illustrated embodiment, the outage detection module 16 includes a Hall Effect current sensor 28, but can include other sensors in other embodiments as desired. The outage detection module 16 provides a HIGH output (via the outage pin in the second connector 26) in response to the current to the incandescent light source 12 being below a predetermined threshold while in an operating state, indicating an outage in the incandescent lamp 30. Conversely, the outage detection module 16 provides a LOW output (via the outage pin in the second connector 26) in response to the current to the incandescent light source 12 being above the predetermined threshold while in an operating state, indicating the incandescent lamp 30 is operating normally. Consequently, the outage detection module 16 is adapted to detect a failure in the incandescent lamp 30 in response to a significant decrease in the power drawn by the incandescent lamp 30, and more specifically, in response to the current drawn by the incandescent lamp 30 decreasing from above the predetermined threshold to below the predetermined threshold while in an operating state (e.g., when receiving a periodic voltage in response to activation of a turn signal switch in the vehicle interior).

Referring again to FIG. 1, the outage detection module 16 also provides the lamp driver circuit 22 with a supply voltage (Vcc), optionally through a suitable DC/DC converter. The lamp driver circuit 22 is configured to relay the output of the outage detection module 16 (HIGH or LOW) to the outage pin of the lamp connector 20. In addition, the lamp driver circuit 22 includes an input protection module 32 to provide isolation for the outage detection module 16 and an LED driver module 34. As also shown in FIG. 1, the lamp driver circuit 22 includes one or more switches 36 (for example an NPN transistor) that couples the lamp outage signal to the lamp connector 20 when the turn signal lamp is in an operating state, for example when the turn signal input is HIGH, indicating activation of the turn signal switch.

As also shown in FIG. 1, the LED driver module 34 includes a constant current source 38. The constant current source (CSS) 38 is electrically connected to an LED PCB 40 through a three-pin connector including (in order from top to bottom in FIG. 1) a pulse-width-modulated analog output, an analog input, and ground. The LED PCB 40 includes a block of LED light sources 14 that are electrically connected in series with each other and that illuminate when driven with a suitable supply voltage. The lumens generated from the LED light sources 14 are based on the amount of current through each diode. The CCS 38 maintains the amount of light output. Alternatively, CCS 38 could be approximated by providing a DC source and a known resistance in series with the LED. The failure of a LED light source or multiple LED light sources will cause a small drop in the total current drawn by the series connected LED light sources. In operation, the lamp driver circuit 22 measures the current or voltage through the LED light sources 14 through the analog input of the three-pin connector when coupled to the LED PCB 40. If the current or voltage through the LED light sources 14 reduces from greater than a predetermined reference value to less than a predetermined reference value while in an operating state, a failure is detected. In the illustrated embodiment, the lamp driver circuit 22 includes a current detecting resister for detecting the output current of the plurality of LEDs 14. Alternatively, the lamp driver circuit 22 can include a voltage measuring circuit for measuring the output voltage of the plurality of LEDs. As a current or voltage measuring unit, the lamp driver circuit 22 is an interface between the plurality of LEDs 14 and the vehicle BCM. In the case of an LED light source outage, the lamp driver circuit 22 causes an outage signal to be sent to the lamp connector 20 for the vehicle BCM. This outage signal (HIGH or LOW) is identical to the outage signal corresponding to an outage in the incandescent lamp 30 of the turn signal lamp, and is provided to the same pin of the lamp connector 20 for receiving an outage signal of the incandescent lamp 30, thus reducing the number of pins required for interfacing with the vehicle BCM.

As noted above, the outage detection module 16 can additionally be integrated into a pre-existing lamp PCB or as an external module connected to the lamp 10 through a wiring harness. Referring now to FIG. 3, a failure detection circuit in accordance with a second embodiment is illustrated and generally designated 50. The failure detection circuit 50 of FIG. 3 is structurally and functionally similar to the failure detection circuit 10 of FIG. 1, except that the failure detection circuit 50 of FIG. 3 includes an outage detection module 16 that is integrated into an existing lamp circuit board. In this embodiment, the failure detection signal is sent out to the main connector 20 of the lamp to the vehicle BCM. Referring now to FIG. 4, a failure detection circuit in accordance with a third embodiment is illustrated and generally designated 60. The failure detection circuit 60 of FIG. 4 is structurally and functionally similar to the failure detection circuit 10 of FIG. 1, except that the failure detection circuit 50 of FIG. 3 includes an outage detection module 16 that is external to the hybrid turn signal lamp. In this embodiment, the outage detection module 16 is mounted to an external PCB 52 and is an interface between the hybrid turn signal lamp and the vehicle BCM. The first connector 24 of the outage detection module 16 includes a turn indicator input, a ground input, a supply voltage, and an outage output. The second connector 26 of the outage detection module 16 includes a supply voltage and ground for the incandescent light source 12 and includes a supply voltage, ground, and an outage output for the lamp driver circuit 22.

Figure 5:
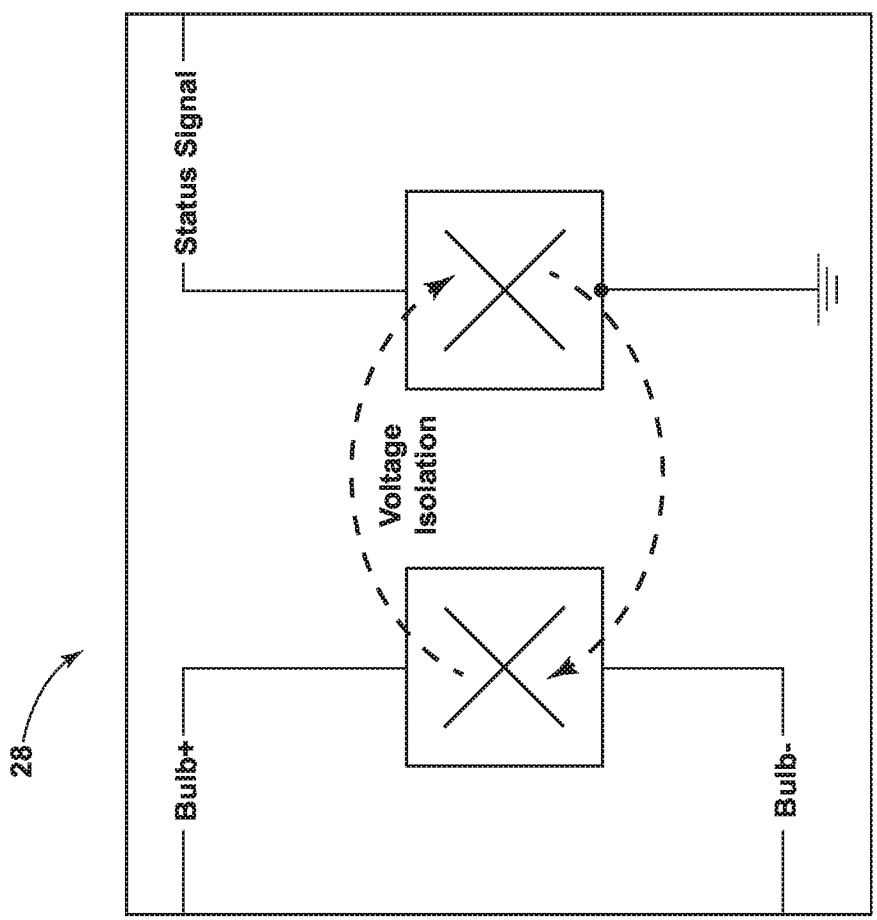
FIG. 5 is a diagram of a Hall Effect current sensor for use with the outage detection module of the present invention.

Lastly, FIG. 5 includes a schematic depiction of the Hall Effect current sensor 28 of the outage detection module 16. The Hall Effect current sensor 28 provides voltage isolation between light sources and provides a low-resistance current conductor in the transmission line of the incandescent light source 12. The outage detection module 16 uses but is not limited to Hall Effect sensors for detecting the electromagnetic field in the line dedicated to supplying current to the incandescent light source 12.

To reiterate, the present invention provides a hybrid turn signal lamp including one or more LED light sources 14, one or more incandescent light sources 12, and a failure detection circuit 10 having an LED driver circuit 22 and an outage detection circuit 16. The failure detection circuit 10 can be located in close proximity to the incandescent light source 12 and the LED light sources 14 within a turn signal assembly. The LED driver circuit 22 is adapted to monitor the current or voltage across the LED light sources 14 and the outage detection module 16 is adapted to monitor the current to the one or more incandescent light sources 12. In response to a detected light source failure, the failure detection circuit 10 transmits a lamp failure signal to a body control module to cause a driver warning. The outage detection circuit 16 provides an isolated circuit that does not affect the current that the light sources receive and therefore does not imply an additional electrical load to the overall system. The outage detection module 16 also reduces the potential risk of failure of detection by centralizing the detection in a single device.

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The invention claimed is:

1. A hybrid turn signal lamp comprising:
   a lamp fixture including:
      an incandescent light source,
      an LED light source; and
   a failure detection circuit including:
      an outage detection module adapted to monitor the current to the incandescent light source for detecting an incandescent light source outage,
      a lamp driver circuit adapted to monitor the current or voltage across the LED light source for detecting an LED light source outage,
      wherein the failure detection circuit is configured to transmit a common lamp failure signal to a body control module in response to a detected incandescent light source outage or a detected LED light source outage to thereby cause a driver warning during activation of the lamp fixture as a turn signal light.

2. The hybrid turn signal lamp of claim 1 wherein the outage detection module is adapted to detect an incandescent light source outage in response to the current drawn by the incandescent light source being less than a predetermined threshold voltage.

3. The hybrid turn signal lamp of claim 1 wherein the lamp driver circuit is adapted to detect an LED light source outage in response to the current across the LED light source being less than a predetermined reference current.

4. The hybrid turn signal lamp of claim 1 wherein the lamp driver circuit is adapted to detect an LED light source outage in response to the voltage across the LED light source being less than a predetermined reference voltage.

5. The hybrid turn signal lamp of claim 1 wherein the lamp driver circuit includes a semiconductor device to selectively couple the common lamp failure signal to the body control module during the activation of the lamp fixture as a turn signal light.

6. The hybrid turn signal lamp of claim 1 wherein the LED light source is one of a plurality of series-connected LED light sources.

7. The hybrid turn signal lamp of claim 1 wherein the outage detection module and the LED driver circuit are incorporated into a common printed circuit board.

8. The hybrid turn signal lamp of claim 1 wherein the outage detection module and the LED driver circuit are incorporated into separate printed circuit boards.

9. A method of detecting a fault in a hybrid turn signal lamp including an incandescent light source and a plurality of LED light sources, the method comprising:
   providing a first power source to the incandescent light source and a second power source to the plurality of LED light sources in response to activation of a turn signal switch;
   monitoring a current drawn by the incandescent light source and monitoring a current or a voltage across the plurality of LED light sources;
   detecting a failure of the incandescent light source or one of the plurality of LED light sources at an outage detection module in proximity to the hybrid turn signal lamp; and
   outputting a common lamp failure signal from the outage detection module to a body control module in response to a detected failure of the incandescent light source or a detected failure of at least one of the plurality of LED light sources.

10. The method of claim 9 wherein detecting a failure of the incandescent light source includes determining the current drawn by the incandescent light source is less than a predetermined threshold while the hybrid turn signal lamp is activated.

11. The method of claim 9 wherein detecting a failure of one of the plurality of LED light sources includes determining the voltage across the plurality of LED light sources is less than a predetermined reference voltage while the hybrid turn signal lamp is activated.

12. The method of claim 9 wherein detecting a failure of one of the plurality of LED light sources includes determining an output current of the plurality of LED light sources is less than a predetermined reference current while the hybrid turn signal lamp is activated.

13. The method of claim 9 wherein the hybrid turn signal lamp comprises a single fixture for both of the incandescent light source and the plurality of LED light sources.

14. The method of claim 9 wherein the common lamp failure signal is a single digital output for both of the incandescent light source and the plurality of LED light sources.

15. The method of claim 14 further including coupling the common lamp failure signal to the body control module during activation of the turn signal switch.

16. The method of claim 9 wherein the plurality of LED light sources are series-connected and further including coupling a constant current source to the plurality of LED light sources.

17. The method of claim 9 further including incorporating the outage detection module onto a printed circuit board for regulating power to the plurality of LED light sources.

18. The method of claim 9 wherein the outage detection module is externally connected to the hybrid turn signal lamp.

* * * * *